United States Patent [19]

Robitaille et al.

[11] Patent Number: 4,929,887
[45] Date of Patent: May 29, 1990

[54] ELECTRICAL OUTLET MONITOR

[75] Inventors: James M. Robitaille, Maple Heights, Ohio; Robert W. Wilson, Austin, Tex.

[73] Assignee: Minnesota Mining and Manufacturing Company, St. Paul, Minn.

[21] Appl. No.: 300,091

[22] Filed: Jan. 19, 1989

[51] Int. Cl.⁵ .................... G01R 31/04; G01R 31/02
[52] U.S. Cl. ................................. 324/66; 324/133; 324/508; 324/509; 324/149; 324/556
[58] Field of Search ............... 324/133, 66, 508, 149

[56] References Cited

U.S. PATENT DOCUMENTS

| | | | |
|---|---|---|---|
| 3,798,540 | 3/1974 | Darden | 324/508 |
| 3,810,003 | 5/1974 | Portoulas | 324/508 |
| 3,952,244 | 4/1976 | Spear | 324/508 |
| 4,082,995 | 4/1978 | Rhude | 324/508 |

FOREIGN PATENT DOCUMENTS 2633786 2/1978 Fed. Rep. of Germany ...... 324/508

Primary Examiner—Reinhard J. Eisenzopf
Assistant Examiner—Jose M. Solis
Attorney, Agent, or Firm—Donald M. Sell; Walter N. Kirn; Jack V. Musgrove

[57] ABSTRACT

A monitor for detecting miswiring in standard 3-spade AC electrical outlets. The monitor includes a housing, prongs for insertion into the outlet to be tested, outlet ports for an external plug, and a banana jack for a wrist strap or other anti-static device. If the outlet is properly wired, a lamp will illuminate. If, however, the outlet is miswired, one of two silicon controlled rectifiers will shunt current around the lamp, extinguishing it, indicating to the user the presence of a faulty outlet. A junction field effect transistor is also provided to activate one of the silicon controlled rectifiers when one particular miswiring condition is present.

16 Claims, 3 Drawing Sheets

ELECTRICAL OUTLET MONITOR

BACKGROUND OF THE INVENTION

1. Field of the Invention

The present invention generally relates to devices for monitoring or regulating electrical power supplies, and more particularly to a monitor for a standard 3-spade 120 volt electrical outlet, which assures the user that the outlet has been wired properly and has acceptable grounding properties.

2. Description of the Prior Art

When electrical outlets are installed in a home or business, it is extremely important that they be properly wired. When such outlets are miswired, they may become totally useless or, even worse, result in serious damage to persons or property. This is especially critical when dealing with sensitive electrical equipment such as computers, or when a proper ground connection is necessary to avoid the danger of electrical shock to the person using the equipment.

There are three wires in a typical 120-volt outlet, namely, the "hot" wire, the neutral wire, and the ground wire. The voltage between the hot wire and either the neutral wire or the ground wire is 120 volts AC. In a standard 3-spade outlet, the hot and neutral wires should be connected to the two flat, parallel contacts, while the ground should be connected to the rounded contact. In modern outlets, one of the ports for the parallel contacts is also smaller than the other; the smaller port is designated for the hot line, and the longer port is for the neutral. Oftentimes, however, these wires are connected to the wrong contacts, or the wiring from the main terminal does not provide the proper three lines to begin with, e.g., there may be two neutral wires and one ground wire leading to the outlet. Additionally, a fourth wire--or second hot wire--is sometimes mistakenly provided which is 180 degrees out of phase with the hot wire (or 120 degrees out of phase in a 3-phase supply), i.e., there is 240 volts between it and the hot wire (or 208 volts in a 3-phase supply). Various permutations which may be had with these four wires are shown in Table 1 in the Description of the Preferred Embodiments below.

Several devices can be used to check for proper wiring in electrical outlets. The most common of these is known as a volt-ohmmeter. This apparatus typically has a dial for selecting (i) current, voltage, or resistance measurements, (ii) the magnitude range of the electrical signal to be tested, and (iii) the kind of voltage to be tested for (AC or DC). AC voltage in an outlet may be checked by inserting two probes into the parallel ports; however, a proper reading does not necessarily mean that the outlet is wired properly. For example, the polarity may be wrong, i.e., the hot and neutral wires are reversed. Volt-ohmmeters also cannot check the static draining properties of the ground connection.

One device developed especially for testing electrical outlets, but rather simple in design, is the three-lamp tester shown in FIG. 1. This device has three separate lamps which, when deciphered according to the instructions, indicate the miswiring condition present. The device will not, however, detect the presence of two hot lines at the neutral and ground contacts when the hot contact is actually the neutral line (condition 22 on Table 1 below). Moreover, this device will erroneously give a proper wiring indication on conditions 2 and 3 in Table 1 when there is sufficient capacitive coupling of the non-connected lead to either the ground or neutral lines. This condition would be encountered, for example, if the ground lead was connected at the outlet but not at the electrical distribution panel, there being coupled capacitance between the ground line and the neutral line along the length of the supply conduit.

The closest prior art device is probably the monitor manufactured by Pilgrim Electric Company of Plainview, New York, under the brand name GAM-1 Smart Static Ground Monitor. The circuitry of this device is shown in FIG. 2. It will be appreciated that the Pilgrim device operates by blocking current flow to the lamp, rather than shunting current around the lamp as contemplated by the present invention. While the GAM-1 is useful for detecting the presence of the hot line, there are several conditions it will not detect, notably when the second hot wire is present (the 240/208 volt setting). Moreover, the GAM-1 will not detect the presence of a hot line on the ground spade (condition 22 on Table 1), which can precipitate a serious accident, especially if the ground connection is being used to discharge static from an individual via a wrist strap or other means. It would, therefore, be desirable and advantageous to devise an electrical outlet monitor which may discern any deviation from proper wiring in a 3-spade outlet, including reverse polarity, extra hot lines, and inadequate grounding characteristics.

Accordingly, the primary object of the present invention is to provide a monitor for standard 3-spade electrical outlets which assures the user of proper hot wire configuration.

Another object of the invention is to provide such a monitor which is also sensitive to the presence of an extra hot wire, including an out-of-phase wire used for 240/208 volt outlets.

Still another object of the invention is to provide a static ground monitor which confirms adequate grounding characteristics of the outlet.

Yet another object of the invention is to provide a monitor which detects the presence of open lines where neutral or ground wires should be.

SUMMARY OF THE INVENTION

The foregoing objects are achieved in an electrical outlet monitor having a lamp which is illuminated only when the outlet is properly wired with hot, neutral, and ground wires. The monitor employs a plurality of silicon controlled rectifiers which shunt the current around the lamp if the polarity is reversed, if the hot wire is missing, if an extra hot wire is present, or if any of the spades are open connections. The monitor further tests the resistance of the safety ground to make sure it is suitable for draining static charge.

BRIEF DESCRIPTION OF THE DRAWINGS

The novel features of the invention are set forth in the appended claims. The invention itself, will be described with reference to the illustrative embodiments in the accompanying drawing, wherein:

DESCRIPTION OF THE PREFERRED EMBODIMENTS

Figure 1:
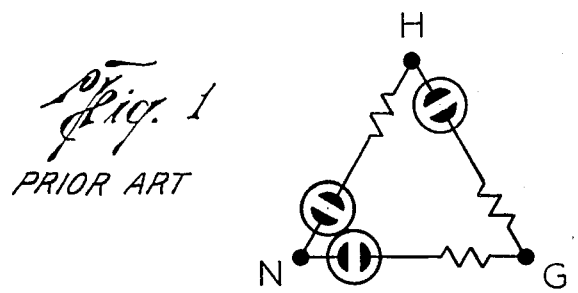
FIG. 1 is a schematic diagram of the prior art three-lamp outlet testing device.
Figure 2:
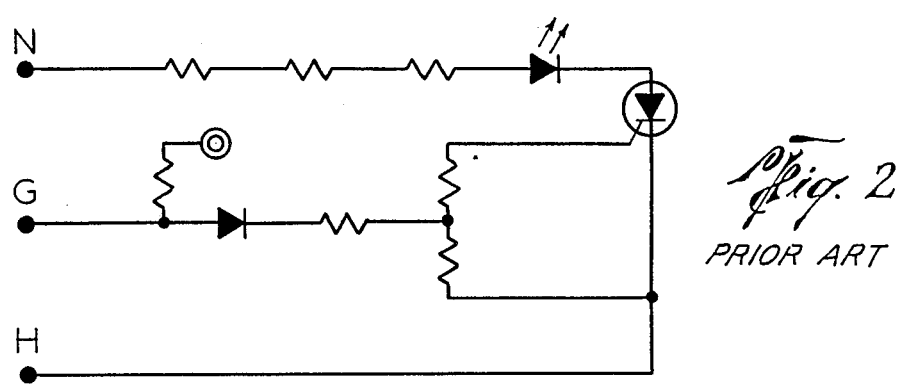
FIG. 2 is a schematic diagram of the prior art Pilgrim Electric device.
Figure 3:
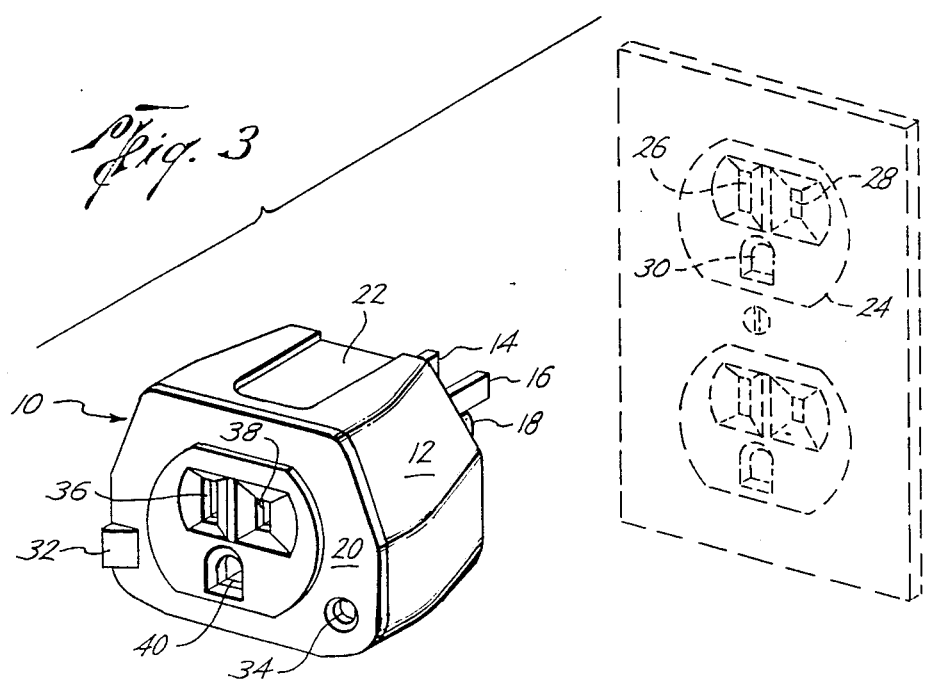
FIG. 3 is a perspective view of the electrical outlet monitor of the present invention shown proximate to the electrical outlet in broken lines.

With reference now to the drawing, and in particular with reference to FIG. 3, there is depicted the electrical outlet monitor 10 of the present invention. Electrical outlet monitor 10 comprises a housing 12, metallic prongs 14, 16 and 18, and a faceplate 20. Housing 12 is constructed of any durable, non-conductive material such as polyvinyl chloride or other hard polymeric insulative material. In practice, it has been found that all of the elements of monitor 10 can be placed within a housing with approximate dimensions of 2"×1½"×1½" (5 cm ×4 cm ×4 cm). Ornamental features such as recessed surface 22 may be added for aesthetic purposes.

Spades 14, 16 and 18 correspond to the prongs on a standard plug, and are designed to mate with the standard 3-spade outlet 24 shown in broken lines in FIG. 3. Standard outlet 24 has three ports therein: two flat, parallel ports 26 and 28, and rounded port 30. In modern outlets, one of the parallel ports 26 is slightly larger than the other, designating the neutral line. The smaller port 28 should be connected to the hot line, while the rounded port 30 is connected to ground. Standard plugs have prongs of similar shape and size to assure that the device being supplied with electricity is connected appropriately to the external line voltage. Accordingly, prong 14 of monitor 10 may be larger (wider) than prong 16, but this is not necessary since polarity of the prongs is fixed by the location of ground prong 18.

Faceplate 20 includes lamp window 32, aperture 34, and ports 36, 38 and 40. Lamp window 32 transmits light from the lamp within monitor 10 (discussed further below) which gives the user an indication of whether the outlet is wired correctly. Lamp window 32 can be any translucent material, preferably a transparent, hard polymeric material such as polycarbonate. Aperture 34 provides access to a banana jack within housing 12, discussed further below. Ports 36, 38 and 40 correspond to ports 26, 28 and 30, respectively, in outlet 24, i.e., port 36 provides access to the neutral line, port 38 provides access to the hot line, and port 40 provides an access to ground.

Figure 4:
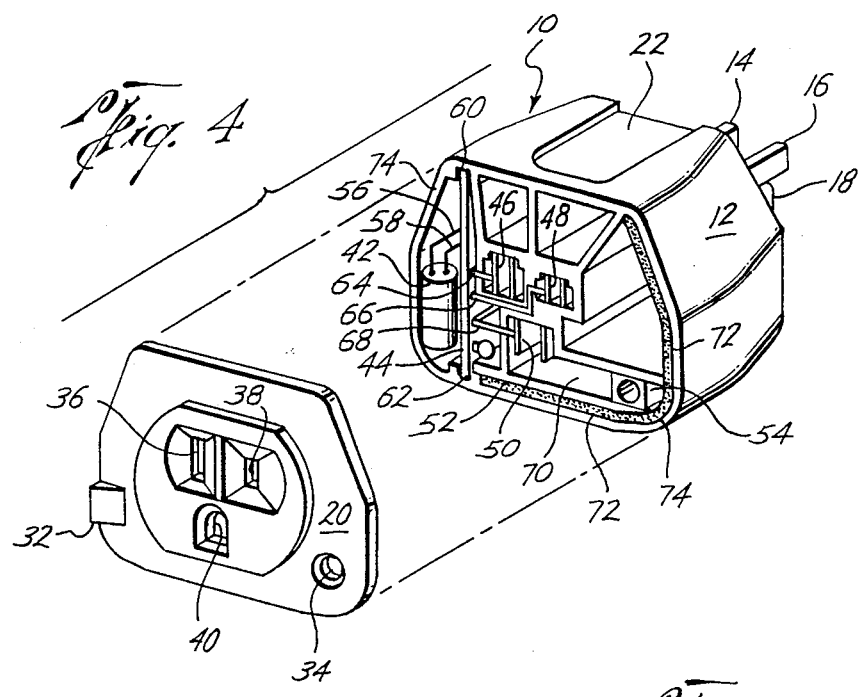
FIG. 4 is a perspective view of the present invention with the front cover removed showing the interior design thereof.

With further reference to FIG. 4, monitor 10 is shown with the faceplate 20 removed. Faceplate 20 may be attached to housing 12 by any convenient means, such as sonic welding, adhesive, screws, etc. FIG. 4 depicts the interior elements of monitor 10, which include lamp 42, circuit board 44, contacts 46, 48 and 50, antenna 52, and banana jack 54. FIG. 4 also discloses the internal structure of housing 12 which includes various compartments and walls for receiving and supporting the internal elements of monitor 10.

In the preferred embodiment, lamp 42 is a gas-discharge type lamp, e.g., a neon lamp, although alternative light sources may be used such as a light-emitting diode. Two wires 56 and 58 connect the lamp to circuit board 44. Circuit board 44 is conveniently held in place by two slots 60 and 62 integrally formed with housing 12. The details of circuit board 44 are described below in conjunction with FIG. 5.

Contacts 46, 48 and 50 lie directly behind ports 36, 38 and 40, respectively, and are further connected to prongs 14, 16 and 18. In other words, contact 46 is connected to the neutral line, contact 48 is connected to the hot line, and contact 50 is connected to the ground line (presuming that outlet 24 is wired correctly). Contacts 46, 48 and 50 are connected to circuit board 44 via wires 64, 66 and 68.

In the preferred embodiment, antenna 52 is a piece of 26 gauge copper wire approximately 5.25 inches (13 cm) long, and is also connected to the circuit board 44. Alternative antennae may be used, such as a 2.5 inch (6 cm) long piece of woven wire, e.g., 0.125 inch (0.3 cm) solder wick. Antenna 52 should be extended its full length within housing 12, and so is expediently placed between a partition 70 and the inner surface 72 of housing wall 74. An adhesive may further be placed along inner surface 72 to insure that antenna 52 remains firmly secured thereto.

Banana jack 54, which is accessible via aperture 34, is connected to ground contact 50. This may be used for grounding a wrist strap, discharge wire, or other antistatic device. Banana jack 54 may be replaced by any other suitable jack for receiving grounding plugs, test leads, etc.

Figure 5:
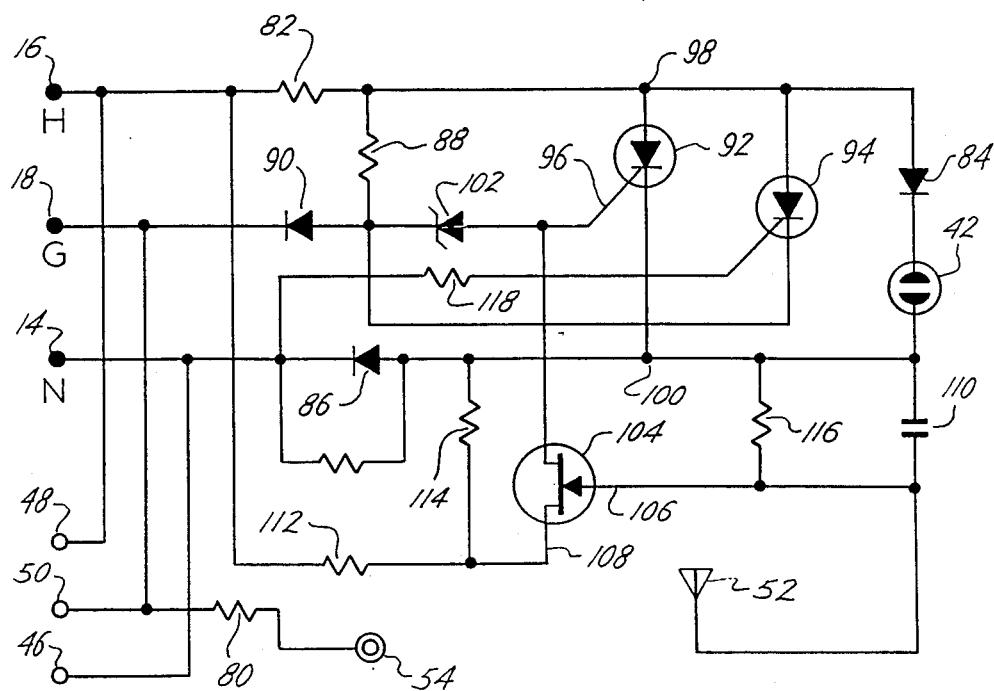
FIG. 5 is a schematic diagram of the electrical circuitry of the present invention.

Referring now to FIG. 5, a schematic diagram of the electrical circuitry of monitor 10 is depicted. Prongs 14, 16 and 18 are shown as terminal inputs to the circuit, with direct connections to contacts 46, 48 and 50, respectively. The letters "N," "H" and "G" refer to the neutral, hot, and ground lines which correlate (in a properly wired circuit) to prongs 14, 16 and 18, respectively. Banana jack 54 is also shown connected to the ground line with an appropriate current-limiting resistor 80 to safeguard personnel from shock hazard. The remaining elements in FIG. 5 may best be understood with reference to the following table which shows the various wiring conditions for outlet 24: Table 1: Wiring Permutations for Standard 3-Spade t,0080

The circuitry of monitor 10 is such that lamp 42 will illuminate only when outlet 24 is properly wired (condition 1). In this state, electricity flows from hot prong 16 through resistor 82, diode 84, lamp 42, and diode 86, to neutral prong 14. Throughout this specification, the term "miswired" refers to any condition other than condition 1 on the preceding table.

Resistor 82 is simply a ballast resistor to limit the current passing through lamp 42. Diode 84 rectifies the current passing through lamp 42 so that it is lit only during the positive half-cycle of AC voltage application. There is also some current flow to ground through resistor 88 and diode 90. In this regard, resistors 82 and 88 act as a voltage divider to supply the voltage necessary to activate lamp 42. It will be understood that other indicator means (such as an audible tone) may be used in place of lamp 42.

Silicon controlled rectifiers (SCR's) 92 and 94 are used to shunt the current around lamp 42 whenever certain miswired connections exist. Examining SCR 92 first, it will be understood that whenever an appropriate gate signal is applied to the gate terminal 96, SCR 92 will switch to a conducting state, and direct current flow from node 98 to node 100, bypassing lamp 42. The gate signal activating SCR 92 is produced under conditions 2, 5, 6, 15, 17, 18, 19 and 23 in the above table. For each of those cases, the gate signal occurs as a result of partial current flow from prong 16, through resistors 82, 88 and zener diode 102, and thence to gate terminal 96.

With condition 2 (ground line open), there is no available path for current to flow through prong 18. As noted above, a small amount of current will flow through resistor 88, and if it cannot bleed off through the ground connection, it is directed instead to zener diode 102. The same rationale applies to conditions 6 and 17.

Condition 5 (hot/neutral reversal) is similar to condition 6 in that current would rather flow through resistor 88 than to ground. This is not, however, due to ground being an open line, but instead is due to the fact that prongs 16 and 18 are at the same potential (zero).

The next condition in which SCR 92 is activated is condition 15. In most residential settings, so-called "220 volt" power is provided by a single-phase signal, i.e., there is only one sinusoidal AC signal in either hot line (the peak voltage between lines is actually 240 volts). In industrial and commercial settings, however, "220 volt" power is provided by 3 overlapping sinusoidal signals in each hot line, known as 3-phase voltage (the peak voltage between the lines is actually 208 volts). Condition 15 may result in activation of SCR 92 due to the voltage at prong 14 being lower than the voltage at prong 18. This is true for the single phase-signal, but for the 3-phase voltage it holds true only if the signal from the hot line (prong 16) leads the signal from the neutral line (prong 14). If condition 15 occurs in a 3-phase voltage setting where the signal at prong 16 lags behind the signal at prong 14, then SCR 94, rather than SCR 92, is activated, as discussed below.

Conversely, for condition 19, SCR 92 is activated only for 3-phase voltage where the signal at prong 16 lags behind the signal at prong 18. For single-phase voltage or 3-phase voltage where the prong 16 signal leads the prong 18 signal, condition 19 results in activation of SCR 94.

For condition 18, when prongs 16 and 18 are both at the same potential, the situation is somewhat similar to that described with condition 2, namely, that current cannot bleed off through prong 18. Current is therefore directed through resistor 88 and zener diode 102, activating SCR 92, and shunting current from lamp 42.

Another case in which SCR 92 is activated is condition 23. This situation is somewhat similar to conditions 5, 15 and 19 in that SCR 92 is activated when the voltage applied to prong 14 is lower than that applied to prong 18. Of course, this will occur only during the negative half-cycle (at prong 14), but this is also the half-cycle during which current would otherwise be drawn through lamp 42 due to diode 84.

SCR 92 is also activated in condition 22, but there is a different current path to gate terminal 96 as compared to the above-explained conditions. For this condition, the antenna 52 provides a true ground reference and is used with junction field-effect transistor (JFET) 104 to turn on SCR 92 and bypass lamp 42. JFET 104 becomes conductive (and thus activates SCR 92) only when the gate-source voltage ($V_{gs}$) across JFET gate 106 and JFET source 108 is greater than the pinchoff voltage for JFET 104 (about −1 volt). One terminal of a capacitor 110 is connected to gate 106 of JFET 104, while the other terminal is connected to lamp 42 and neutral prong 14.

During the negative half-cycle (at prong 14), the half-cycle during which current would otherwise be drawn through lamp 42, the voltage $V_{gs}$ will be divided by the impedance associated with the capacitances of antenna 52 and capacitor 110. Thus, if capacitor 110 is sufficiently small, $V_{gs}$ will rise enough to exceed the pinch-off voltage of JFET 104 and allow SCR 92 to switch before sufficient voltage is applied to lamp 42 for it to illuminate. Current flows through resistor 112 to both JFET 104 and resistor 114.

Conversely, capacitor 110 cannot be too small since, for a properly wired circuit, $V_{gs}$ must remain sufficiently negative throughout the positive half-cycle to prevent JFET 104 from becoming conductive. This is achieved by regulating the charge remaining on capacitor 110 (and in antenna 52). This factor is further controlled by the capacitances of capacitor 110 and antenna 52, as well as by the value of resistor 116, which acts simply as a bleed resistor for capacitor 110 and antenna 52. A very high resistance (two hundred M$\Omega$) is preferred. It has also been empirically found that, for use with the particular antenna described above, a capacitance of approximately 27 picofarads is adequate for meeting the dual criteria as regards JFET 104.

Before discussing SCR 94, it should be noted that reactive loads connected to a properly wired circuit may inadvertently activate SCR 92. This would occur, for example, if heavy machinery were plugged into the same circuit being tested. It will, therefore, be understood that, in order to avoid improper activation of SCR 92 in such cases, zener diode 102 acts to screen SCR 92 from reactive loads appearing at prong 14.

As mentioned above, SCR 94 is activated only in two situations, namely, conditions 15 and 19, and then only for 3-phase power where the signal at prong 16 lags behind the signal at prong 14 (condition 15), or single-phase and 3-phase power where the signal at prong 16 leads the signal at prong 18 (condition 19). Under these circumstances, the ground connection Will have a lower voltage than the neutral connection at any time that there would otherwise be sufficient voltage to light lamp 42. Therefore, current flows from prong 14 to prong 18 via resistor 118 and SCR 94. Those skilled in the art will appreciate that, similar to SCR 92, SCR 94 is sensitive to resistive loads which may cause the voltage at the neutral connection to exceed the voltage at the ground connection. To insure that lamp 42 will remain lit even if the line is heavily loaded, resistor 18 acts as a screen for SCR 94.

The remaining conditions result in direct shunting of the current without activation of SCR's 92 and 94, or result in no current path at all. Specifically, for conditions 3, 9, 11, 14 and 21 current flows directly from prong 16 to prong 18 without lighting lamp 42. For conditions 4, 7, 8, 10, 12, 13, 16, 20, 24 and 25, there is no current flow at all. It will be understood that there is also no current flow for certain obvious miswired conditions not listed in Table 1, e.g., all lines being hot, all lines being ground, all lines being neutral, all lines being open, etc.

Electrical outlet monitor 10 is also capable of testing the grounding characteristics of outlet 24. As alluded to above, the ground spade 30 is often used to drain static charge, for example, from a wrist strap. However, if the resistance of the ground connection is too high, say more than about 5000 $\Omega$, then the ground is not suitable for static charge elimination in critical situations, such as microelectronic clean rooms. Those skilled in the art will appreciate that the resistance R through prong 18 necessary to activate SCR 92, and hence extinguish lamp 42, is approximately given by the expression:

$$R = (V_z \times R_{88}) + V_1$$

where $V_z$ = zener voltage of diode 102

$R_{88}$ = resistance of resistor 88, and $V_1$ = turn-on voltage of lamp 42.

It has been empirically found that, in order to set R equal to approximately 5000 Ω, it is necessary to use a resistor 88 having an approximate resistance of 100 kΩ and a diode 102 having an approximate zener voltage of 5 volts. Of course, an open ground line has an effective resistance greater than 5000Ω.

Figure 6:
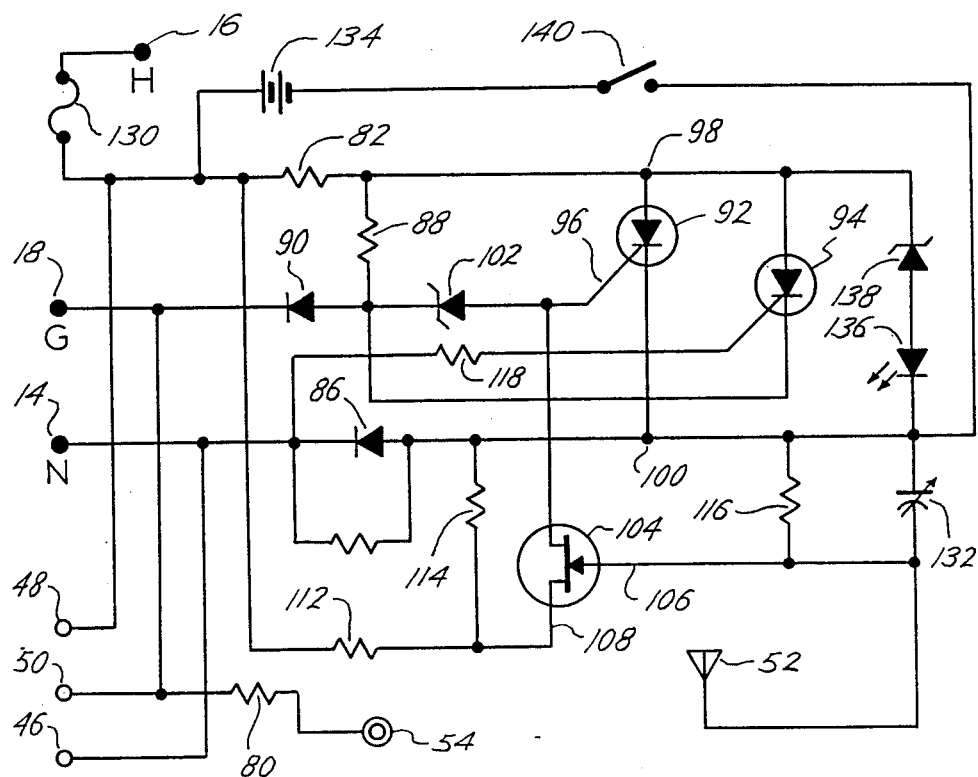
FIG. 6 is a schematic diagram of an alternative embodiment of the present invention.

With further reference to FIG. 6, an alternative embodiment of the present invention is shown having several added features. First, a fuse 130 has been inserted at prong 16 in order to avoid damage to monitor 10 which may be caused by excessive line voltages. Fuse 130 could alternatively be a circuit breaker. Secondly, capacitor 110 has now been replaced with a variable capacitor 132. As noted above, the capacitance of this component is critical to proper operation of JFET !04, so providing a variable capacitor eases the operational requirements. Variable capacitor 132 would be tuned at the factory prior to shipping.

The final feature added in FIG. 6 is a lamp test. In order to provide for a lamp test, it is first necessary to furnish a battery 134. Furthermore, because the turn-on voltage of a neon lamp is rather high (about 85 volts), it is expedient to use a low-power light emitting diode (LED) 136 rather than neon lamp 42. LED 136 is preferably green. Provision of LED 136 also requires use of a zener diode 138. A switch 140 allows testing of LED 136.

Although the invention has been described with reference to specific embodiments, this description is not meant to be construed in a limiting sense. Various modifications of the disclosed embodiment, as well as alternative embodiments of the invention, will become apparent to persons skilled in the art upon reference to the description of the invention. It is therefore contemplated that the appended claims will cover such modifications that fall within the true scope of the invention.

I claim:

1. An apparatus for monitoring a standard 3-spade electrical outlet supplying alternating current, the outlet having hot, neutral and ground spades, comprising:
   hot, neutral and ground prongs for mating with the hot, neutral and ground spades on the 3-spade outlet, respectively;
   a first resistor connected to said hot prong;
   a second resistor connected to said first resistor;
   a first diode connected in series between said second resistor and said ground prong, for directing current from said hot prong to said ground prong;
   a light source electrically connected to said neutral prong;
   a second diode connected in series between said first resistor and said light source for directing current form said hot prong to said neutral prong;
   a first silicon controlled rectifier connected to said first resistor and said neutral prong in parallel with said light source, a gate lead of said first silicon controlled rectifier being electrically connected to a zener diode, said zener diode being further connected to said second resistor and said first diode, said first silicon controlled rectifier shunting current from said light source when electrical resistance through said ground prong exceeds approximately 5000 ohms, or when voltage at said neutral prong is lower than voltage at said ground prong;
   a second silicon controlled rectifier connected to said first resistor, and to said second resistor and said first diode, in parallel with said light source, a gate lead of said second silicon controlled rectifier being electrically connected to a third resistor, said third resistor being further connected to said neutral prong, said second silicon controlled rectifier shunting current from said light source when voltage at said ground prong is lower than voltage at said neutral prong;
   means for activating said first silicon controlled rectifier when voltage at said neutral and ground prongs is nonzero and voltage at said hot prong is simultaneously neutral, said activating means comprising:
     a junction field effect transistor having gate, source, and drain leads, said drain lead being connected to said gate of said first silicon controlled rectifier and said source lead being connected to said hot prong;
   a capacitor having first and second terminals, said first terminal being connected to said gate lead of said junction field effect transistor, and said second terminal being connected to said light source and said neutral prong; and
   an antenna for supplying a true ground reference, said antenna being connected in parallel to said gate lead of said junction field effect transistor and said first terminal of said capacitor;
   hot, neutral and ground outlet ports connected to said hot, neutral and ground prongs, respectively, for receiving an external plug;
   a banana jack for receiving a discharge wire, said banana jack being electrically connected to said ground prong; and
   a housing, said first, second and third resistors, first and second diodes, first and second silicon controlled rectifiers, light source, and activating means being located within said housing, said prongs extending outwardly from said housing in a direction opposite said ports.

2. The apparatus of claim 1 wherein said capacitor is a variable capacitor, and further comprising:
   fuse means for preventing electrical damage to the apparatus; and
   test means for insuring proper working condition of said light source.

3. An apparatus for monitoring an electrical power supply having hot, neutral and ground spades, comprising:
   indicator means having at least two states, a first state corresponding to a properly wired power supply, and a second state corresponding to an improperly wired power supply, said first state occurring when said indicator means is energized;
   prong means for electrically connecting said indicator means to the electrical power supply, including hot, neutral and ground prongs for mating with the hot, neutral and ground spades of the power supply;
   shunting means for preventing electrical current from energizing said indicator means when the electrical power supply is miswired, said shunting means including a silicon controlled rectifier which shunts current from said indicator means when electrical resistance through said ground prong exceeds approximately 1500 ohms, or when said voltage at said neutral prong is lower than voltage at said ground prong; and means for housing said indicator means, prong means, and shunting means.

4. An apparatus for monitoring a 3-spade electrical outlet having hot, neutral and ground spades, comprising:

indicator means having at least two states, a first state corresponding to a properly wired outlet, and a second state corresponding to an improperly wired power outlet, said first state occurring when said indicator means is energized;

hot, neutral and ground prongs for mating with the hot, neutral and ground prongs on the 3- spade outlet, respectively, said prongs being electrically connected to said indicator means;

shunting means for preventing electrical current from energizing said indicator means when the electrical outlet is miswired, said shunting means including first and second silicon controlled rectifiers each connected in parallel with said indicator means; and a housing, said indicator means and said shunting means being located within said housing, and said prongs extending outwardly from said housing.

5. An apparatus for monitoring an electrical power supply having hot, neutral and ground spades, comprising:

indicator means having at least two states, a first state corresponding to a properly wired power supply, and a second state corresponding to an improperly wired power supply, said indicator means being energized in said first state;

prong means for electrically connecting said indicator means to the electrical power supply, including hot, neutral and ground prongs for mating with the hot, neutral and ground spades of the power supply;

shunting means for preventing electrical current from energizing said indicator means when the electrical power supply is miswired, said shunting means being connected in parallel to said indicator means, said shunting means including first and second silicon controlled rectifiers each connected in parallel with said indicator means; and means for housing said indicator means, prong means, and shunting means.

6. The apparatus of claim 5 wherein said first silicon controlled rectifier shunts current from said indicator means when electrical resistance through said ground prong exceeds approximately 5000 ohms, or when voltage at said neutral prong is lower than voltage at said ground prong. indicator means when electrical resistance through said ground prong exceeds approximately 5000 ohms, or when voltage at said neutral prong is lower than voltage at said ground prong.

7. The apparatus of claim 6 wherein said second silicon controlled rectifier shunts current from said indicator means when voltage at said ground prong is lower than voltage at said neutral prong.

8. The apparatus of claim 7 further comprising means for activating said first silicon controlled rectifier when voltage at said neutral and ground prongs is nonzero and voltage at said hot prong is simultaneously zero.

9. The apparatus of claim 8 wherein said means for activating said first silicon controlled rectifier comprises:

a junction field effect transistor having gate, source, and drain leads, said drain lead being connected to a gate of said first silicon controlled rectifier;

capacitor means connected in parallel to said gate lead of said junction field effect transistor; and antenna means for supplying a true ground reference, said antenna means being connected in parallel to said gate lead of said junction field effect transistor.

10. The apparatus of claim 9 wherein said indicator means comprises a light source connected in series with a diode, said diode directing current from said hot prong to said neutral prong.

11. The apparatus of claim 4 wherein said first silicon controlled rectifier shunts current from said indicator means when electrical resistance through said ground prong exceeds approximately 5000 ohms, or when voltage at said neutral prong is lower than voltage at said ground prong.

12. The apparatus of claim 11 wherein said second silicon controlled rectifier shunts current from said indicator means when voltage at said ground prong is lower than voltage at said neutral prong.

13. The apparatus of claim 12 further comprising means for activating said first silicon controlled rectifier when voltage at said neutral and ground prongs is nonzero and voltage at said hot prong is simultaneously zero.

14. The apparatus of claim 13 wherein said means for activating said first silicon controlled rectifier comprises:

a junction field effect transistor having gate, source, and drain leads, said drain lead being connected to a gate of said first silicon controlled rectifier;

a capacitor connected in parallel to said gate lead of said junction field effect transistor; and an antenna for supplying a true ground reference, said antenna being connected in parallel to said gate lead of said junction field effect transistor.

15. The apparatus of claim 14 wherein said indicator means comprises a light source connected in series with a diode, said diode directing current from said hot prong to said neutral prong.

16. The apparatus of claim 15 further comprising:

hot, neutral and ground outlet ports connected to said hot, neutral and ground prongs, respectively, for receiving an external plug; and jack means for receiving a discharge wire, said jack means being electrically connected to said ground prong.

* * * * *

UNITED STATES PATENT AND TRADEMARK OFFICE
CERTIFICATE OF CORRECTION

PATENT NO. : 4,929,887
DATED : May 29, 1990
INVENTOR(S) : Robitaille et al.

It is certified that error appears in the above-identified patent and that said Letters Patent is hereby corrected as shown below:

Claim 1, Column 7, Line 61 change "form" to --from--.

Claim 3, Column 9, Line 4 delete "said"

Claim 4, Column 9, Line 18 change "prongs" to --spades--.

Claim 6, Column 9, lines 58-61 delete "indicator means when electrical resistance through said ground prong exceeds approximately 5000 ohms, or when voltage at said neutral prong is lower than voltage at said ground prong."

Specification

Column 4, Line 41 change "3-Spade t" to --3 Spade Outlet--.

Column 4, Line 41 is missing Table 1.

Column 6, Line 9 change "." to --,--.

Column 6, Line 45 change "18" to --118--.

Column 7, Line 1 change "+" to --$\frac{1}{7}$--.

Column 7, Line 23 change "!04" to --104--.

Signed and Sealed this

Seventh Day of January, 1992

Attest:

HARRY F. MANBECK, JR.

*Attesting Officer*   *Commissioner of Patents and Trademarks*

-8-

Outlet

+ = 120 volts to neutral or ground
− = 240/208 volts to "+"
N = neutral
G = ground
O = open or unwired connection

| Condition | Hot | Neutral | Ground |
|---|---|---|---|
| 1 | + | N | G |
| 2 | + | N | O |
| 3 | + | O | G |
| 4 | + | O | O |
| 5 | N | + | G |
| 6 | N | + | O |
| 7 | O | + | G |
| 8 | O | + | O |
| 9 | N | G | + |
| 10 | O | G | + |
| 11 | N | O | + |
| 12 | O | O | + |
| 13 | O | N | G |
| 14 | + | + | G |
| 15 | + | − | G |
| 16 | + | + | O |
| 17 | + | − | O |
| 18 | + | N | + |
| 19 | + | N | − |
| 20 | + | O | + |
| 21 | + | O | − |
| 22 | N | + | + |
| 23 | N | + | − |
| 24 | O | + | + |
| 25 | O | + | − |

The circuitry of monitor 10 is such that lamp 42 will illuminate only when outlet 24 is properly wired (condition 1). In this state, electricity flows from hot prong 16 through resistor 82, diode 84, lamp 42, and diode 86, to neutral prong 14. Throughout this